United States Patent [19]

Dupraz et al.

[11] Patent Number: 5,295,207
[45] Date of Patent: Mar. 15, 1994

[54] OPTICAL APPARATUS FOR MEASURING CURRENT IN A GROUNDED METAL-CLAD INSTALLATION

[75] Inventors: Jean-Pierre Dupraz, Lyons; Edmond Thuries, Meyzieu, both of France

[73] Assignee: GEC Alsthom SA, Paris, France

[21] Appl. No.: 977,296

[22] Filed: Nov. 16, 1992

[30] Foreign Application Priority Data

Nov. 18, 1991 [FR] France ................. 91 14174

[51] Int. Cl.$^5$ ............................ G01R 31/00
[52] U.S. Cl. .......................... 385/12; 324/96
[58] Field of Search ............ 385/12, 147; 324/96, 324/97, 117 R, 72.5

[56] References Cited

U.S. PATENT DOCUMENTS

| | | | |
|---|---|---|---|
| 4,255,018 | 3/1981 | Ulrich et al. | 385/12 |
| 4,496,211 | 1/1985 | Daniel | 385/147 X |
| 4,868,495 | 9/1989 | Einzig et al. | 324/97 |
| 5,066,903 | 11/1991 | Ochi | 324/96 |
| 5,124,634 | 6/1992 | Ulmer, Jr. et al. | 324/72.5 X |
| 5,136,236 | 8/1992 | Bohnert et al. | 324/117 R X |

FOREIGN PATENT DOCUMENTS

| | | |
|---|---|---|
| 4025911 | 4/1991 | Fed. Rep. of Germany . |
| 2209937 | 7/1974 | France . |
| 2430112 | 1/1980 | France . |

OTHER PUBLICATIONS

Patent Abstracts of Japan, vol. 14, No. 258 (P-1055) Jun. 4, 1990 & JP-A-2 069671 (Tokyo Electric Power) Mar. 8, 1990.
Patent Abstracts of Japan, vol. 11, No. 79 (P-555) Mar. 11, 1987 & JP-A-61 235 758 (Sumitomo Electric) Oct. 21, 1986.

*Primary Examiner*—John D. Lee
*Assistant Examiner*—Hemang Sanghavi
*Attorney, Agent, or Firm*—Sughrue, Mion, Zinn, Macpeak & Seas

[57] ABSTRACT

An optical transformer designed to equip a grounded metal-clad installation, wherein the transformer includes a disk which is disposed transversely to the axis of the cladding and which is provided with openings via which the conductors pass, optical fibers being disposed at the periphery of said openings and being connected to an associated optical interface placed outside the cladding.

10 Claims, 2 Drawing Sheets

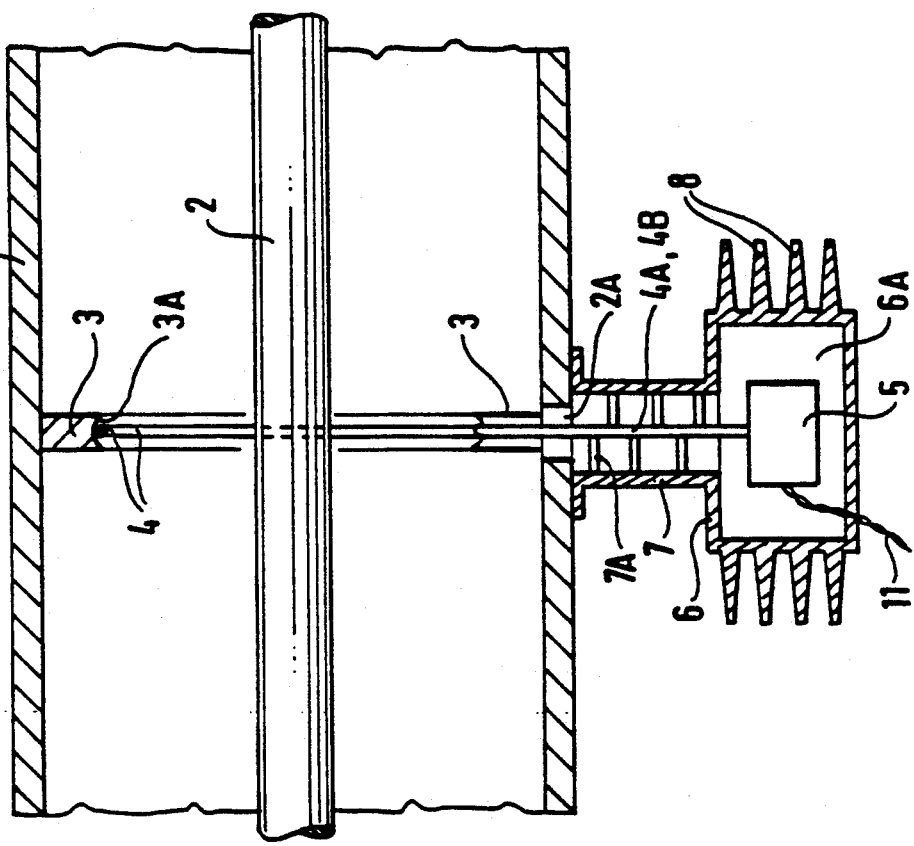
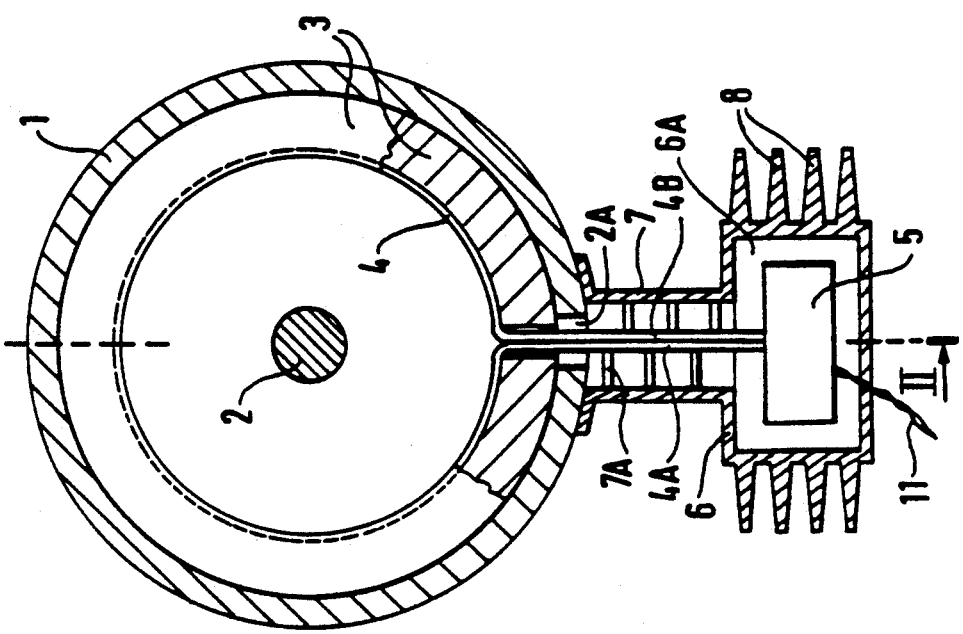

OPTICAL APPARATUS FOR MEASURING CURRENT IN A GROUNDED METAL-CLAD INSTALLATION

The present invention relates to optical apparatus for measuring current in a grounded metal-clad installation which may also be referred to as a shielded installation.

BACKGROUND OF THE INVENTION

In the field of high-voltage overhead electrical installations, it is well-known to use current-measuring apparatus that uses the Faraday effect, in particular by means of optical fibers through which light rays pass.

It is recalled that the Faraday effect is a magneto-optical effect resulting from an electromagnetic wave interacting with matter in the presence of a field.

Under the action of a magnetic field in the same direction as the electromagnetic wave, some types of matter present optical activity expressed by induced non-reciprocal circular birefringence, i.e. by wave propagation speeds through the matter that are different depending on whether the wave has circular polarization that is dextrorotatory or levorotatory.

In order to measure an electrical current, the Faraday effect is used either on a linearly-polarized light wave which may be considered to be the sum of two circularly-polarized waves, one of which is dextrorotatory and the other of which is levorotatory, or else via two counter-propagating light waves that are both circularly polarized the same way (either levorotatory or dextrorotatory). In the first case, the rotation of the polarization plane is measured by polarimetry techniques, and, in the second case, the phase difference is measured by the "Sagnac" interferometry technique.

In both cases, the phase shift angle due to the Faraday effect is proportional to the instantaneous magnitude of the current to be measured.

The light waves used for performing the measurement are conveyed via an optical fiber which goes one or more times round the electrical conductor whose current is to be measured.

Measurement by using the Faraday effect would seem to be particularly advantageous for measuring currents in a grounded metal-clad type installation, or a shielded-type installation. Measuring in this way makes it possible to improve compactness considerably, since conventionally-used current transformers take up several tens of centimeters of axial space. Installing an optical fiber takes up only a few centimeters of axial space. Moreover, optical measurement is not sensitive to the electromagnetic influences that exist in a shielded installation. The following points are other arguments for installing optical-type current transformers in shielded installations:

they offer a wide operating range, since the phenomenon of magnetic core saturation which limits the operating range of conventional transformers is not encountered in optical transformers;

it is possible to standardize the apparatus, since it can be used without adaption in all types of shielded installations or shielded stations; and the apparatus has a wide range of uses.

The state of the art in this field is illustrated by the article "Development of optical instrument transformers" by T. Sawa, K. Kurosawa, T. Kaminsishi, T. Yokota, referenced 89TD380-7-PWRD, IEEE/PES, 1989 Transmission and Distribution Conference, Apr. 2 to 7, 1989.

A first difficulty encountered in installing an optical transformer in a shielded installation is to ensure that there is not too great a difference in potential between certain points on the optical fiber. Such a difference in potential could lead to breakdown.

Another difficulty is to avoid too high a temperature in the optical interfaces associated with the fibers to detect the measurement signal. The temperature inside the cladding of the installations can exceed 90° C. In order to ensure that the apparatus remains intact, and that the measurements are accurate, the temperature inside the associated optical interfaces must not exceed about 70° C.

An object of the invention is to solve those technical problems and to provide an optical transformer whose optical fibers receive a relatively low electrical voltage, and whose associated optical interfaces are in no danger of overheating.

Document FR-A-2,430,112 describes a current transformer constituted by optical fibers embedded in an insulating support. That document does not deal with limiting heat exchange between the fibers and the measuring interface.

Document DE-A-40 25 911 shows optical fibers and a housing inside the metal cladding of a shielded line. Those components are therefore subject to considerable overheating which may prevent them from operating properly.

SUMMARY OF THE INVENTION

The invention provides a current transformer designed to equip an electrical installation of the grounded metal-clad type including at least one cylindrical metal cladding filled with dielectric gas and containing at least one conductor that is disposed parallel to the axis of the cladding, the transformer being of the Faraday-effect type and including, for each conductor, an optical fiber surrounding the conductor, said fiber being connected to an auxiliary optical interface for injecting at least one input light wave into the fiber, and for processing the output light waves, wherein said current transformer includes a support in the form of a disk having its plane perpendicular to the axis and having its periphery in contact with a cross-section inside the cladding, the disk having at least one opening via which one of said conductors passes, the opening including a groove inside which the optical fiber is placed, the optical fiber going at least once round the conductor, and having its two ends connected to the associated optical interface disposed outside the cladding, the optical interface being placed in an enclosure that communicates with the cladding via a gastight passage through which the optical fibers pass.

Advantageously, the enclosure is equipped with cooling means.

Preferably, the passage is equipped with means for limiting the heat exchange that takes place by conduction and by convection between the enclosure and the cladding.

In a particular embodiment, the above-mentioned means comprise baffles and/or diaphragms made of a porous material having poor thermal conductivity.

In a variant, the passage is filled with a material based on silicone.

The cooling means are advantageously constituted by metal fins outside the enclosure, the enclosure being made of metal.

In a variant, the cooling means comprise a circuit through which a coolant such as Freon circulates.

In a particular embodiment of the invention, the disk is made of metal and the optical fibers are placed directly in the groove.

In a variant, the disk is made of an insulating material such as epoxy resin.

In which case, the optical fibers may be disposed in an insulating tube.

When the cladding contains three three-phase conductors, an optical fiber may be placed at the periphery of the disk and may go at least once round the three conductors, the fiber being used to measure the residual current.

BRIEF DESCRIPTION OF THE DRAWINGS

Embodiments of the invention are described by way of example with reference to the accompanying drawings, in which:

FIG. 1 is a view in axial section through single-phase shielded cladding containing an optical transformer of the invention;

FIG. 2 is a view in section on the line II—II shown in FIG. 1;

DETAILED DESCRIPTION

Figure 3:
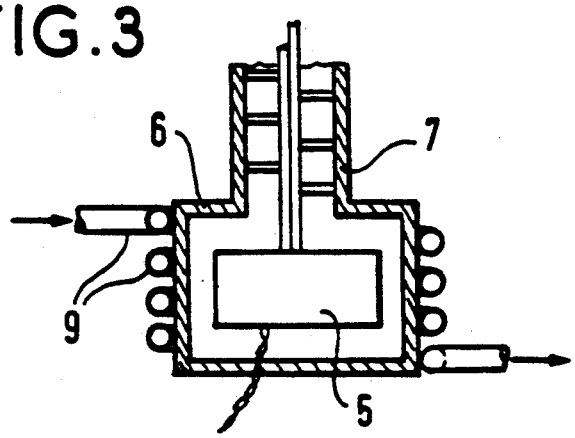
FIG. 3 is a fragmentary view of the optical transformer of a variant embodiment.

In FIG. 1, reference 1 designates grounded metal cladding for a single-phase installation. The cladding 1 is filled with a gas having good dielectric properties, such as sulfur hexafluoride SF6, under a pressure of a few bars. The cladding contains a metal conductor 2 held by means of insulating cones that are not shown.

The optical transformer of the invention includes a disk 3 disposed perpendicular to the conductor 2. The periphery of the disk fits the inside surface of the metal cladding 2. The disk is fixed to the cladding by any well-known conventional means such as being screwed to a flange, or being clamped between two flanges, etc.

The disk 3 has a through circular opening to enable the conductor 2 to pass therethrough. The periphery of the opening has a groove 3A in which an optical fiber 4 is disposed, the optical fiber going round the groove one or more times. The optical fiber is fixed to the bottom of the groove, e.g. by being glued.

The ends 4A and 4B of the fiber are connected to an associated optical interface 5 which includes, in particular, means for generating at least one light wave, means for injecting the wave into at least one of the ends of the optical fiber, and means for collecting and processing the light wave output via the ends of the fiber. The interface 5 may be connected to a processing and power-supply center via an electrical and/or optical link 11. Such an associated interface is well-known, e.g. reference may be made to French Patent No. 87 05102 which gives a non-limiting embodiment thereof.

The disk 3 may be made of metal, in which case the points of the optical fiber that are inside the groove are at ground potential, and there is no danger of breakdown occurring due to the fiber. In a variant, the disk 3 may be made of an insulating material. Since the opening in the disk is large, the groove 3A is distant from the conductor 2. The value of the potential at the groove 3A is low, and there is no danger of breakdown occurring due to the presence of the optical fiber. A first technical problem is therefore solved.

The second technical problem is solved as follows: the associated interface is placed in an enclosure 6 outside the cladding 1. The inside 6A of the enclosure communicates with the inside of the cladding via a passage 7 fixed to the cladding 1 in gastight manner and in alignment with a hole 2A therein. The ends of the optical fiber 4A and 4B pass through the passage. In order to avoid overheating inside the enclosure 6, the passage 7 is equipped with baffles or diaphragms 7A made of a material that is a poor conductor of heat so as to limit transmission by convection or by conduction of the heat coming from the cladding 2. If this measure is insufficient, the metal enclosure 6 is provided with cooling fins 8 that co-operate with ambient air, or with a cooling circuit 9, e.g. fed with Freon (FIG. 3).

Figure 4:
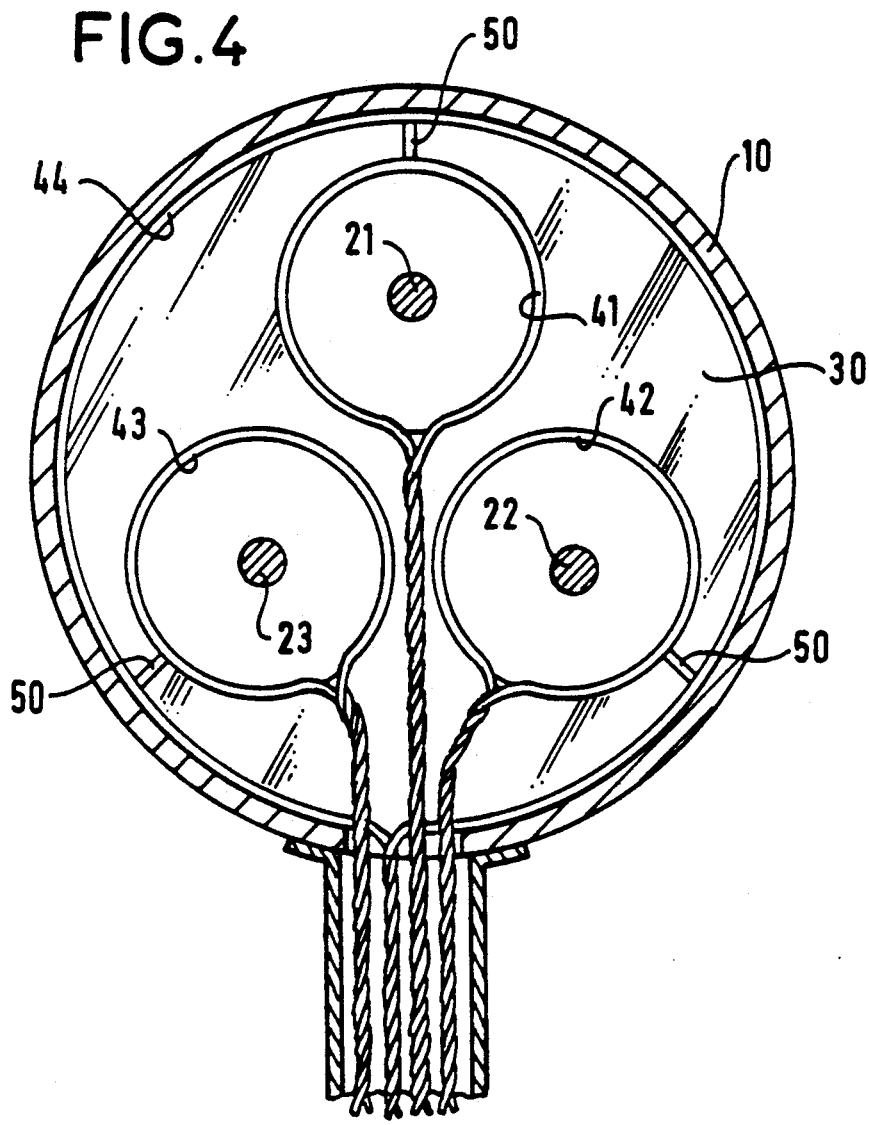
FIG. 4 is a fragmentary view in axial section through three-phase shielded cladding containing an optical transformer of the invention.

FIG. 4 shows a three-phase enclosure equipped with a transformer of the invention. The enclosure has gastight grounded metal cladding 10 filled with SF6 and inside which three conductors 21, 22, and 23 are placed. The optical transformer includes a disk 30 provided with three through openings via which the conductors pass. Slots such as 50 in the disk prevent the disk from acting as a short-circuit winding. Each opening has an internal groove in which a respective optical fiber (41, 42 and 43) is placed going at least once round the groove and with its end connected, as in the preceding figures, to an associated optical interface outside the cladding and not shown in FIG. 4. FIG. 4 shows that the output ends of the fibers are wound helically, as is common practice.

As in the preceding examples, the disk 30 may be made of metal and the fibers are at ground potential. In a variant, the disk is made of an insulating material such as epoxy resin, and the openings in the disk are large so that the fibers are as far as possible from the respective conductors, and therefore at the lowest possible potential.

As is usual, the optical fibers may be protected by plastic tubes. The disk 30 may be provided with a peripheral groove in which an optical fiber 44 is placed going at least once round the groove, and therefore round all three conductors 21, 22, and 23. The fiber is connected to the associated optical interface and enables the residual current to be measured, and this is often useful in protective devices for protecting electrical installations.

The invention applies to equipping any single-phase or poly-phase grounded metal-clad electrical installation.

We claim:

1. In a current transformer designed to equip an electrical installation of the grounded metal-clad type including at least one cylindrical metal cladding filled with dielectric gas and containing at least one conductor disposed parallel to the axis of the cladding, the transformer being of the Faraday-effect type and including, for each conductor, an optical fiber surrounding the conductor, said fiber being connected to an auxiliary optical interface for injecting at least one input light wave into the fiber, and for processing the output light waves, wherein said current transformer includes a support in the form of a disk having its plane perpendicular to said axis and having a periphery in contact with a cross-section inside the cladding, said disk having at least one opening, said at least one conductor passing through, said disk opening including a groove inside said opening, said optical fiber being placed in said groove with, the optical fiber going at least once around said conductor, and having two ends thereof connected to aid associated optical interface disposed outside said cladding, the improvement comprising, a gastight passage extending exteriorly of the cladding, and an enclosure coupled to an end of said gastight passage means remote from said cladding, said optical interface being placed in an enclosure, and communicating via said gastight passage to the interior of said cladding and about said two optical fiber ends passing through said gastight passage and being connected to said optical interface within said enclosure, and wherein said gastight passage includes means within said gastight passage, between said enclosure and said cladding, for limiting heat exchange by conduction and by convection.

2. A transformer according to claim 1, wherein said means for limiting heat exchange by conduction and convection within said gastight passage comprising a plurality of baffles or diaphragms, positioned within said passage and extending transversely between a gastight passage internal wall and the optical fibers passing therethrough, and wherein said baffles or diaphragms are made of a porous material having poor thermal conductivity.

3. A transformer according to claim 1, wherein said enclosure further includes cooling means for dissipating heat from the interior of said cladding escaping from said cladding to said enclosure past said means for limiting heat exchange by conduction and convection within said gastight passage.

4. A transformer according to claim 3, wherein said enclosure is a metal enclosure and wherein said cooling means are metal fins outside said enclosure, and extending outwardly of said metal enclosure.

5. A transformer according to claim 3, wherein said cooling means comprise a circuit through which a coolant such as Freon circulates.

6. A transformer according to claim 1, wherein the disk is made of metal and the optical fibers are placed directly in said groove.

7. A transformer according to claim 1, wherein the disk is made of an insulating material such as epoxy resin.

8. A transformer according to claim 7, wherein the optical fibers are disposed inside an insulating tube disposed in the groove in the disk.

9. A three phase current transformer designed to equip an electrical three-phase installation of the grounded metal-clad type, including one cylindrical metal cladding filled with dielectric gas and containing three spaced conductors disposed parallel to the axis of the cladding, the transformer including a disk having its plane perpendicular to said axis and having a periphery in contact with an inside wall of the cladding, said disk having three openings through which pass the three conductors respectively, said disk having an internal groove in each of said three openings in which is located an optical fiber surrounding the corresponding conductor, making at least one turn, the optical fibers each having two ends thereof connected to an associated interface placed outside the cladding in an enclosure remote from said cladding that communicates with said cladding via a gastight passage through which the optical fibers pass, said gastight passage being provided with means preventing the heat from the inside of the cladding reaching the interface by conduction or convection through said gastight passage, and said disk having at least one slot to prevent said disk from constituting a short-circuit winding.

10. A transformer according to claim 9, further comprising an additional optical fiber placed about the periphery of the disk and passing at least once around said the three conductors, and said additional optical fiber including ends passing through said gastight passage from said cladding to said enclosure for use in measuring the residual current of said transformer.

* * * * *